DEFENSIVE PUBLICATION

UNITED STATES PATENT OFFICE

Published at the request of the applicant or owner in accordance with the Notice of Dec. 16, 1969, 869 O.G. 687. The abstracts of Defensive Publication applications are identified by distinctly numbered series and are arranged chronologically. The heading of each abstract indicates the number of pages of specification, including claims and sheets of drawings contained in the application as originally filed. The files of these applications are available to the public for inspection and reproduction may be purchased for 30 cents a sheet.

Defensive Publication applications have not been examined as to the merits of alleged invention. The Patent Office makes no assertion as to the novelty of the disclosed subject matter.

PUBLISHED NOVEMBER 23, 1971

892 O.G. 1210

T892,006
PHOTOSENSITIVE POLYMERS

Thomas M. Laakso and Jack L. R. Williams, both of Kodak Park, Rochester, N.Y. 14650

Filed Sept. 29, 1970, Ser. No. 76,597
**Int. Cl. G03c *1/68***
U.S. Cl. 96—115
No Drawing. 12 Pages Specification

There are disclosed light-sensitive polyester condensation products of the bis(p-carboxybenzylidene)cycloalkanones, or their esters with organic diols containing recurring groups having the formula

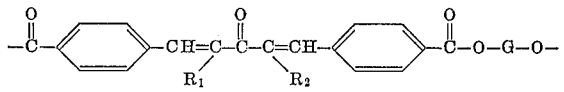

wherein $R_1$ and $R_2$ are hydrogen atoms, or together represent the atoms necessary to complete a cycloalkanone ring having 5 to 8 carbon atoms in the ring and G is the residue remaining after removal of the hydroxyl groups from an organic diol. These polyesters are obtained by reacting a diol with a dibenzylidenealkanone monomer having the formula

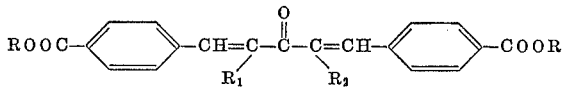

wherein $R_1$ and $R_2$ are as defined above and R is a hydrogen atom, a lower alkyl group or an aryl group. An example of such a monomer disclosed is 2,5-di(4-carbomethoxybenzylidene)cyclopentanone having the formula

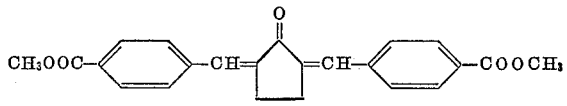

This monomer is obtained by the reaction of methyl 4-formylbenzoate and cyclopentanone. There is disclosed the preparation of a light-sensitive polyester by the reaction of dimethylisophathalate and 2,5-di(4-carbomethoxybenzylidene)cyclopentanone with 1,4-(β-hydroxyethoxy)cyclohexane. The light-sensitive polyesters are useful in photo-mechanical reproduction processes such as for lithographic purposes or as photo-resists.